United States Patent [19]
Lewis

[11] Patent Number: 5,748,051
[45] Date of Patent: May 5, 1998

[54] LOW PHASE NOISE UHF AND MICROWAVE OSCILLATOR

[75] Inventor: Charles Lewis, San Diego, Calif.

[73] Assignee: Z-Communications, Inc., San Diego, Calif.

[21] Appl. No.: 648,909

[22] Filed: May 16, 1996

[51] Int. Cl.[6] .................... H03B 5/12; H03B 5/18
[52] U.S. Cl. .................. 331/117 R; 331/96; 331/117 D; 331/175; 331/177 V
[58] Field of Search ..................... 331/36 C, 96, 331/101, 102, 116 R, 116 FE, 117 R, 117 FE, 117 D, 175, 177 V

[56] References Cited

U.S. PATENT DOCUMENTS

4,146,850  3/1979  Fache et al. .................. 331/117 R

*Primary Examiner*—David Mis
*Attorney, Agent, or Firm*—J. W. Gipple; Gipple & Hale

[57] ABSTRACT

An oscillator circuit is described which exhibits low phase noise characteristics and has special application in UHF and microwave technologies. The oscillator circuit of the invention includes a band pass filter having specific capacitor and inductor values which can be optimized so that the circuit has a loaded Q very close to the resonator's unloaded Q.

14 Claims, 7 Drawing Sheets

LOW PHASE NOISE UHF AND MICROWAVE OSCILLATOR

BACKGROUND OF THE INVENTION

1. Field of the Invention

This invention relates to low cost, low phase noise UHF and microwave oscillators having an operating frequency that can range from 400 MHz to 6 GHz. The oscillator of this invention is designed to be used in many applications where low phase noise is the main design consideration.

2. Description of the Related Art

There are many oscillating circuits available for use at high frequencies and each has certain performance limitations. The well known Colpitts oscillator works well up to about 1 GHz. Above 1 GHz, the configuration generally referred to as the standard microwave oscillator is used and works very well as a low cost, medium phase noise voltage controlled oscillator. The standard configuration does not exhibit good phase noise performance, even with a high Q resonator.

Other high frequency oscillators include a modulated transistor oscillator disclosed in U.S. Pat. No. 3,855,553 to Cronin, a television tuner oscillator with feedback for more low frequency power disclosed in U.S. Pat. No. 4,564,822 to Saitoh et al., a low noise oscillator disclosed in U.S. Pat. No. 4,580,109 to Lockwood, a varactor voltage-controlled UHF oscillator disclosed in a German Patent Number 28 11 080, a a modified Clapp oscillator disclosed in British Patent 11,114,023 to Michalek. A Power oscillator circuit was disclosed at an IRE show in New York City, Mar. 20, 1961; the schematic diagram for this circuit is classified in Class 331, Subclass 117, in the U.S. Patent and Trademark Office.

Other circuits dealing with phase noise problems include a negative resistance oscillator with electronically tunable base inductance described in U.S. Pat. No. 5,373,264 to Higgins, Jr., a low noise oscillator disclosed in U.S. Pat. No. 5,166,647 to Riebman, and a voltage control oscillator which suppresses phase noise caused by internal noise of the oscillator disclosed generally in U.S. Pat. No. 5,351,014 to Ichiyoshi. Further examples can be found in U.S. Pat. No. 5,337,014 issued to Najle et al. for a circuit for phase noise measurements, in U.S. Pat. No. 5,341,110 to Nardi for a low phase noise reference oscillator, and in U.S. Pat. No. 5,374,902 to Bradley for an ultra low phase noise microwave synthesizer.

SUMMARY OF THE INVENTION

The present invention is concerned with an oscillator circuit for use in UHF and microwave applications which exhibit low phase noise characteristics. More specifically, the present invention is directed to an oscillator circuit which includes a band pass filter having specific capacitor and inductor values which can be optimized so that the circuit has a loaded Q very close to the resonator's unloaded Q, thereby resulting in significantly reduced phase noise.

In accordance with the invention, the phase shift of the band pass filter is the negative of the circuit's transistor so as to make the overall phase shift equal to zero at the oscillation frequency. The insertion loss of the band pass filter is small enough to make the overall gain greater than unity. Capacitor values are selected to have a small enough value and the output impedance of the transistor does not significantly load the resonator. Inductor values, on the other hand, are large enough that the input impedance of the transistor also does not significantly load the resonator.

A need exists for a low cost, low phase noise oscillator operating at UHF and microwave frequencies. An objective of the present invention, therefore, is to provide an oscillating circuit that takes the best possible advantage of the resonator's Q, or quality factor to provide an output having low phase noise. Many resonators are suitable for use in this circuit, including coaxial, LC, microstrip or stripline resonators. An important feature of this invention that for a given choice of resonator the phase noise of the oscillator is so low that it comes as close as possible to the theoretical limit which is a function of the resonator's Q.

A goal of this invention is to minimize the oscillator's phase noise, which depends on the loaded Q of the circuit. The subject low phase noise oscillator is superior to the UHF and microwave oscillators presently in use because this circuit takes better advantage of the resonator's Q. The standard Microwave oscillator currently in use, for example, does not take as good advantage of the resonator's Q as is revealed through the following analysis.

DETAILED DESCRIPTION OF THE INVENTION

Figure 10:
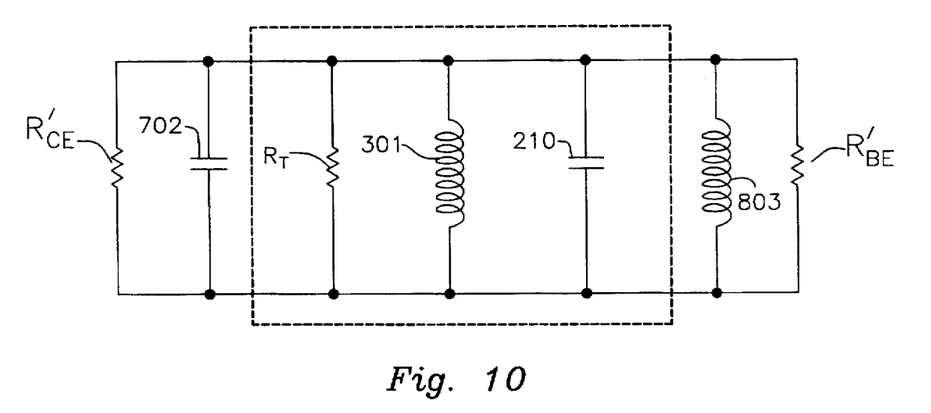
FIG. 10 is a schematic drawing illustrating an equivalent embodiment of the circuit illustrated in FIG. 9.
Figure 11:
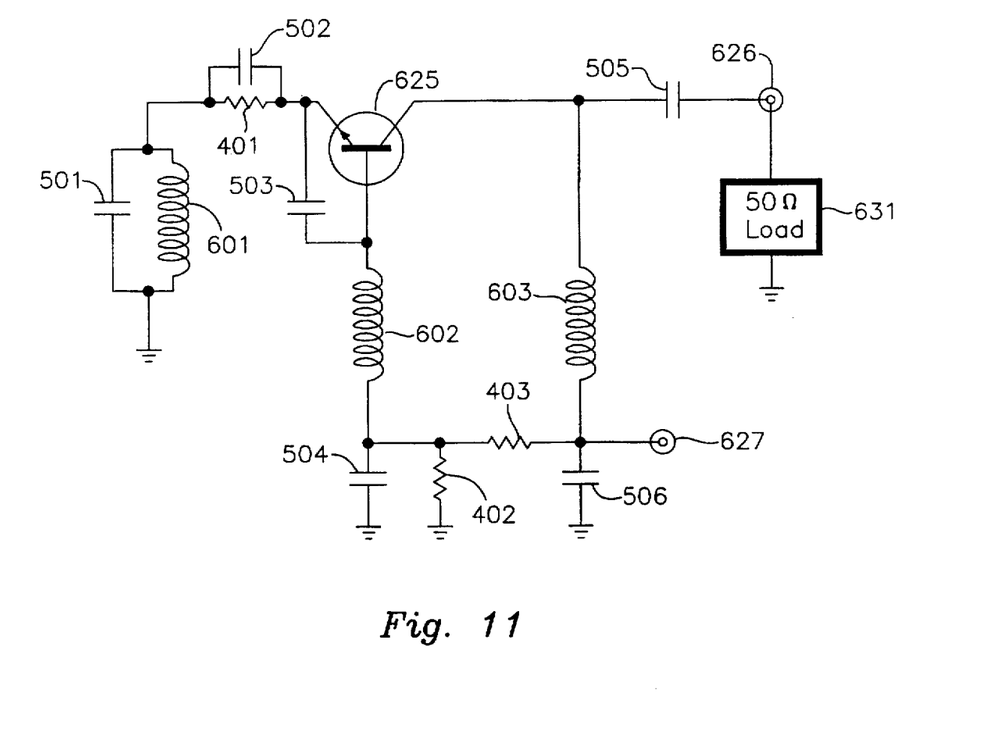
FIG. 11 is a schematic drawing illustrating the prior art standard microwave oscillator.
Figure 12:
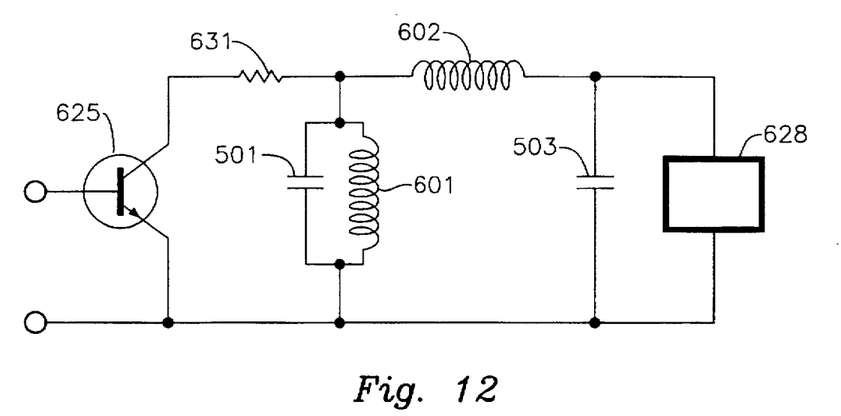
FIG. 12 is a schematic drawing illustrating the open loop configuration of the prior art standard microwave oscillator shown in FIG. 11 without the biasing components.
Figure 13:
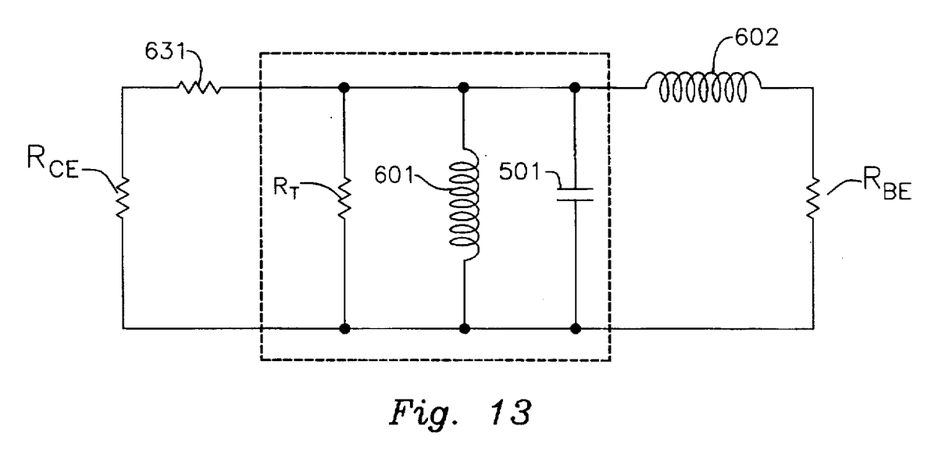
FIG. 13 is an equivalent embodiment of the circuit shown in FIG. 12.

The preferred embodiment and best mode of the present invention is shown in FIGS. I thru 10. An embodiment of the prior art is shown in FIGS. 11 thru 13.

The low phase noise oscillator illustrated in FIG. I shows an NPN bipolar transistor 94 with capacitor 208 connected between the emitter and the base. The collector is connected to a capacitor 207 which is in turn connected to a common potential. One terminal of inductor 304 is connected to the collector and the other terminal is connected through capacitor 206 to a common potential. A terminal 92, which supplies the oscillator with D.C. bias voltage, is connected to the circuit between inductor 304 and capacitor 206. Biasing resistor 103 is connected on one side to the junction formed by inductor 304 and capacitor 206 and on the other side resistor 103 is connected through a biasing resistor 102 to a common potential. Capacitor 205 is connected from the junction between resistor 103 -and resistor 102 to a common potential. Capacitor 209 is connected from the junction formed by resistors 102 and 103 and capacitor 205 to the load 90. The designation "load" can refer to the circuit that receives and utilizes the low phase noise oscillating signal. In the embodiment shown in FIG. 1, this load circuit 90 is represented as a low impedance 50 ohm load. Inductor 303 is connected on one side to the base and on the other side to the junction formed by the terminals of capacitors 209 and 205, and resistors 102 and 103.

Figure 1:
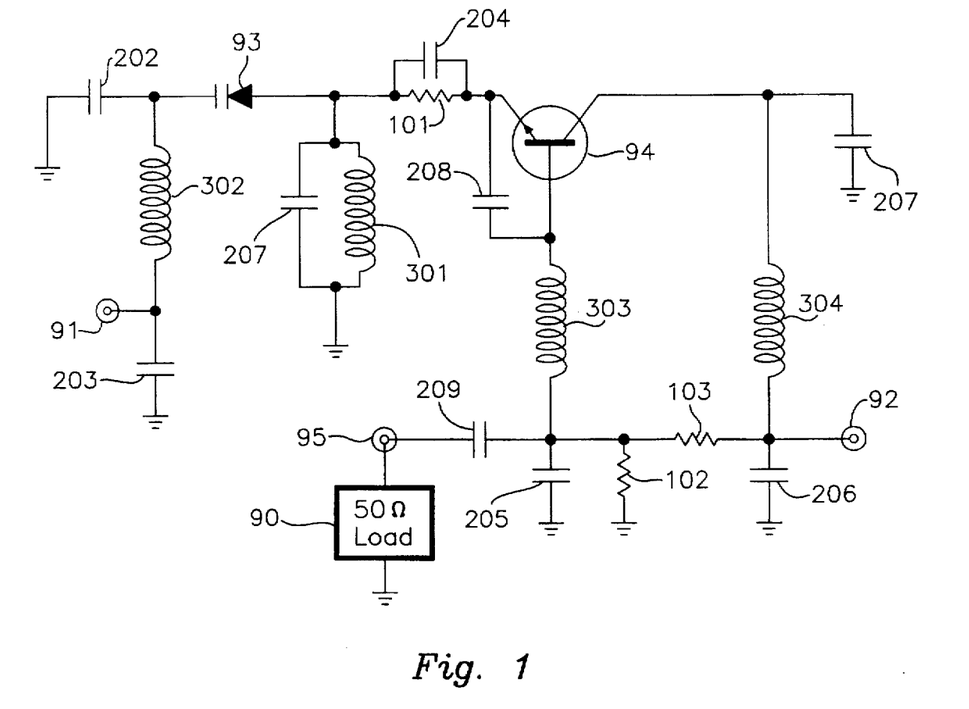
FIG. 1 is a schematic drawing illustrating the oscillator circuit of the invention complete with biasing components.

Capacitor 204 and resistor 101 are connected in parallel; one side of this parallel pair is connected to the junction formed by the emitter and capacitor 208 and the other side of the parallel pair 204 and 101 is connected to the anode of varactor 93. A resonant circuit comprising capacitor 207 and inductor 301 connected in parallel is connected at one side to the junction formed by the terminals of capacitor 204, resistor 101 and anode of the varactor 93 and at the other side to a common potential. The cathode terminal of varactor 93 is connected through inductor 302 to capacitor 203 which is in turn connected to a common potential. A capacitor 202 is connected on one side to the junction formed by varactor 93 and inductor 302 and on the other side to a common potential. A terminal for a varactor control voltage is connected to the junction between inductor 302 and capacitor 203.

In operation, the biasing of the transistor 94, i.e., the establishment of the D.C. collector current and collector to emitter voltage, is accomplished through the biasing resistors 101, 102 and 103 and the application of a D.C. voltage which is done through the D.C. supply terminal 92. Transistor 94 is biased to operate in the linear region, but is pushed into Class C mode by the oscillating signal. Capacitors 203, 204, 205, and 206 are radiofrequency (RF) bypass capacitors. The capacitance values of these RF bypass capacitors are chosen so that these circuit elements act as short circuits to the AC signal voltages in the circuit. Inductors 302 and 304 are RF chokes, i.e., their inductance values are chosen so that they can be considered open circuits at the frequency of oscillation. Inductor 304 also provides D.C. bias current to the collector of transistor 94. Inductor 302 provides D.C. bias voltage to varactor 93.

The inductor 301 and capacitor 207 constitute a parallel resonant circuit. The oscillation frequency of this circuit determines the oscillation frequency of the output of the circuit through terminal 95 across the load 90. The oscillation frequency of this parallel resonant circuit can be modified by varactor 93 in series with capacitor 202. In this embodiment, therefore, the circuit functions as a voltage controlled oscillator in which the oscillation frequency of the circuit is determined by the voltage applied at the varactor control terminal 91. In other embodiments, the circuit can function as a fixed frequency oscillator by removing varactor 93, capacitors 202 and 203, inductor 302 and terminal 91 from the circuit in FIG. 1. (Which results in the circuit in FIG. 2).

Figure 3:
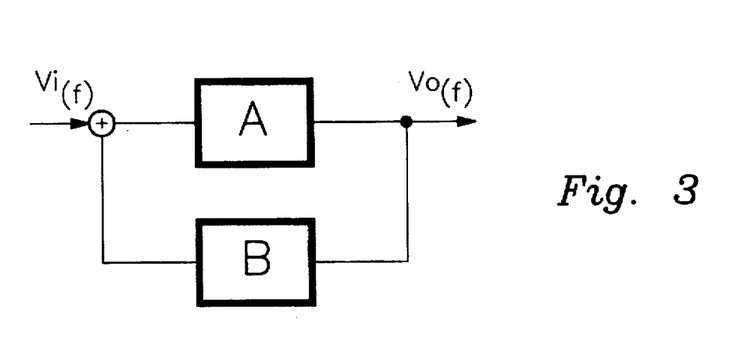
FIG. 3 is a block diagram of an oscillator.

An oscillator can be considered a linear system with positive feedback. FIG. 3 shows a block diagram of a positive feedback system. Vi(f) and Vo(f) are the input voltage and output voltage, respectively. Block A represents the active device of the system and has a complex voltage gain designated A(f) to indicate that the voltage gain of the active device is a function of frequency. The feedback network is represented by the block labeled B and the complex voltage gain of the feedback network is labeled B(f) to indicate that it is also a function of the frequency of the signal. The product A(f)B(f) is called the open loop gain and is designated H(f). Oscillation occurs in a linear system represented by FIG. 3 when two oscillation conditions are met: One, the magnitude of the open loop gain must be greater than unity and two, the phase of the open loop gain must be zero.

Figure 4:
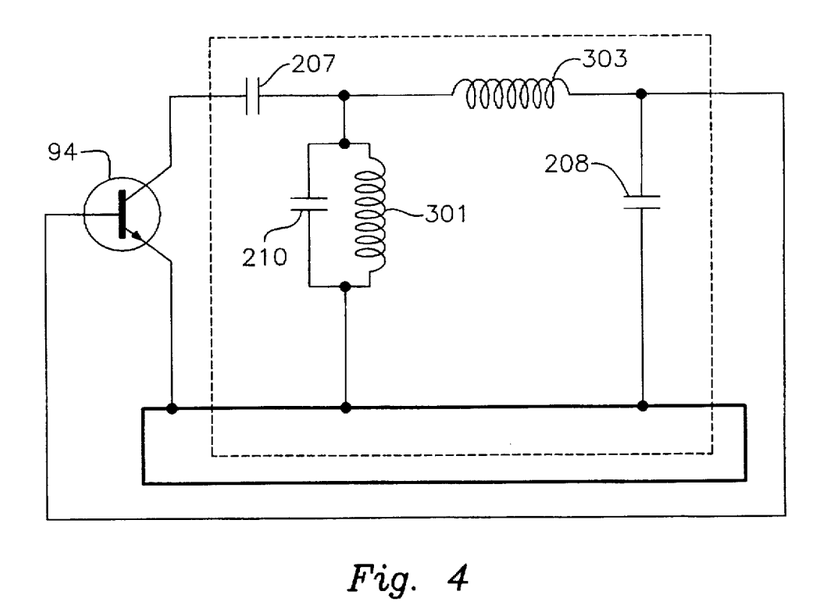
FIG. 4 is a schematic drawing illustrating the oscillator circuit of the invention without the biasing components.
Figure 5:
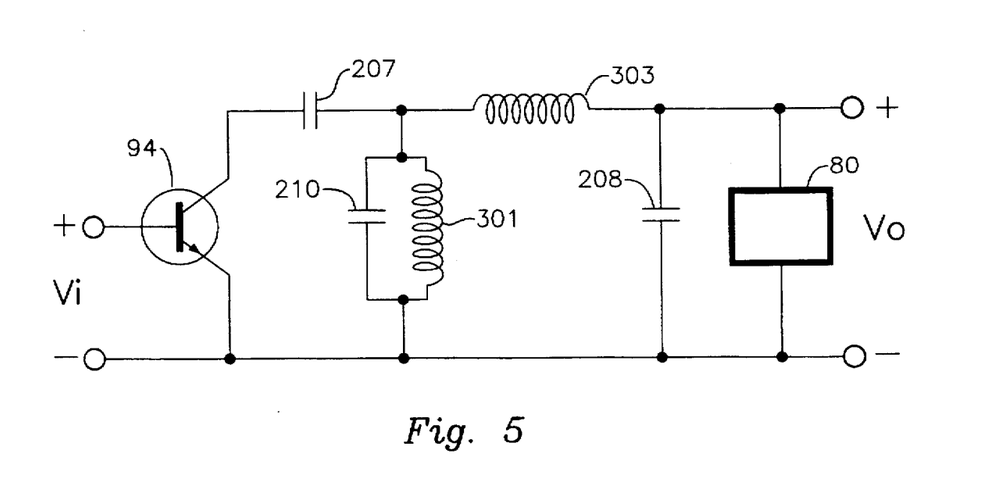
FIG. 5 is a schematic drawing illustrating the open loop configuration of the oscillator circuit of the invention without the biasing components.

The circuit illustrated in FIG. 1 can be viewed as a positive feedback system of the type represented in FIG.3. When this circuit is analyzed at RF frequencies, the influence of the bypass capacitors and RF chokes can be neglected. The resulting circuit has the configuration show in FIG. 4. In this equivalent circuit, capacitor 210 represents the equivalent capacitance of capacitor 201 plus the series combination of 202 and varactor 93 of FIG. 1. The oscillator of FIG. 1 can be viewed as a network the output of which is connected to its input as shown in FIG. 4. The open loop gain of the oscillator is the voltage gain of the network shown in FIG. 5. Element 80 represents the input impedance of the transistor and is well determined.

The design goal of this invention is to minimize the oscillator's phase noise. Phase noise is related to the loaded Q of the circuit by the following equation, equation 1:

$$L(f) = \frac{KTF}{P_{AVS}}\left[1 + \left(\frac{\frac{f_0}{2Q_L}}{f}\right)^2\right]$$

where:

K: Boltzman's constant

T: Temperature in degrees Kelvin $P_{avs}$: Power available from the source driving the active device, which is actually the power available from the output of that device.

f: Offset from oscillation frequency in Hertz.

$Q_L$: Loaded Q

F: Noise figure of the active device.

$f_o$: Oscillation frequency (Hertz).

L(f) is the ratio of phase noise power integrated over a 1 Hertz bandwidth to signal power. L(f) is the ratio of two powers per Hertz so it has dimensions of $Hz^{-1}$ and is usually expressed in dB/Hz. It is important to notice that phase noise is minimized by maximizing the loaded Q, $Q_L$.

The subject low phase noise oscillator is superior to the UHF and microwave oscillators presently in use because this circuit takes better advantage of the resonator's Q. The standard microwave oscillator currently in use, for example, does not take as good advantage of the resonator's Q as is revealed through the following analysis.

Figure 6:
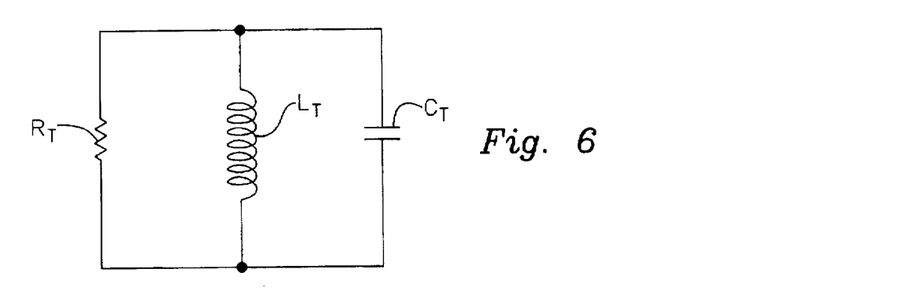
FIG. 6 is a schematic drawing of a parallel resonant circuit reduced to three components.

A parallel resonant circuit as shown in FIG. 6, can be reduced to three components: an inductor $L_T$, a capacitor $C_T$, and a resistor $R_T$, where $L_T$ represents the inductance of the inductor in the tank circuit, $C_T$ represents the capacitance of the capacitor in the tank circuit and $R_T$ represents the inherent resistance of the tank circuit. Therefore, $R_T$ does not correspond to a discrete circuit element. The resonant frequency is defined as the frequency at which the reactance of $L_T$ equals the reactance of $C_T$. From A.C. theory we get, respectively, equations two and three $$X_{LT} = 2\pi f L_T \quad X_{CT} = \frac{1}{2\pi f C_T}$$

The resonant frequency, fo, given by equation four, is, therefore, $$f_0 = \frac{1}{2\pi \sqrt{L_T C_T}}$$

At the resonant frequency, both the inductor $L_T$ and the capacitor $C_T$ have the same reactance which we will call $X_O$. Q is defined by equation 5 as $$Q = \frac{R_T}{X_0}$$

Hence, higher values of $R_T$, $X_O$ being constant, result in higher values of Q.

Figure 7:
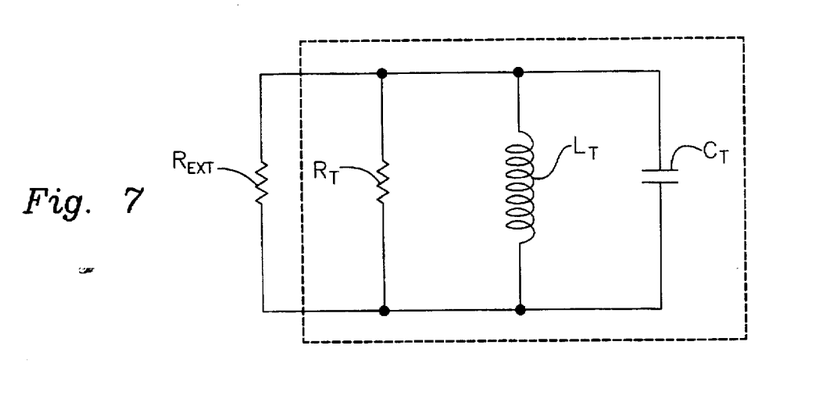
FIG. 7 is a schematic drawing showing an external resistor connected in parallel with the resonator; the dotted lines enclose the resonator or tank circuit.

The parallel resonator's Q is affected by external loading. If an external resistor is connected in parallel with the resonator, the resulting configuration is as illustrated in FIG. 7. The tank circuit is shown enclosed in dotted lines. We define the unloaded Q, or $Q_U$, as the intrinsic Q of the resonator which is given by equation six as follows:

$$Q_U = \frac{R_T}{X_0}$$

Because $R_T$ and $R_{ext}$ are connected in parallel in FIG. 7, they result in an equivalent resistance, given by equation seven, of $$R_{EQV} = \frac{1}{\frac{1}{R_{EXT}} + \frac{1}{R_T}}$$

The loaded Q ($Q_L$) is defined by equation eight as $$Q_L = \frac{R_{EQV}}{X_0}$$

Comparing the values for $Q_U$ and $Q_L$ reveals that $Q_U \geq Q_L$ because the equivalent resistance of two resistors connected in parallel is always less than or equal to either of the two resistances. (They are equal only in the case where $R_{ext} = \infty$).

Therefore, we can conclude that the loaded Q ($Q_L$) takes into account the effect of the resistance external to the resonator; that the loaded Q ($Q_L$) approaches its upper limit of unloaded Q ($Q_U$) as the value of the external resistor, $R_{ext}$, approaches infinity; and that the loaded Q ($Q_L$) approaches its lower limit of zero as the value of the external resistor, $R_{ext}$, approaches zero.

Figure 8:
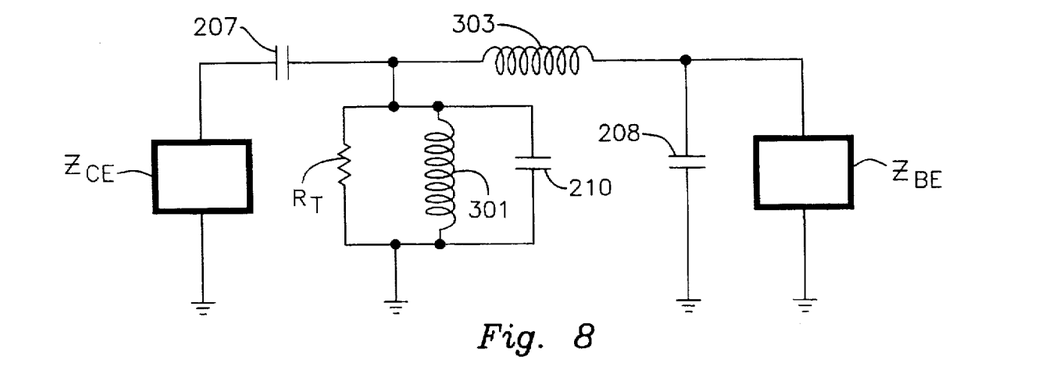
FIG. 8 is a schematic drawing illustrating the equivalent circuit of the resonator plus the impedances directly connected to it.

The resonators of the networks shown in FIGS. 7 and 8, even though they are represented as a parallel combination of a capacitor and an inductor, do have finite Q's due to resistive or ohmic losses. Therefore, they have a certain resistance $R_T$. Because resonators (be they $L_C$, coaxial line, etc.) are intended to have high Q, $R_T$ has a relatively high value.

FIG. 8 illustrates the external resistances on the tank circuit that affect $Q_L$. Note that $Z_{ce}$ and $Z_{be}$ are included. $Z_{ce}$ is the collector-emitter impedance of transistor 94 and $Z_{be}$ is the base-emitter impedance of transistor 94. At oscillation frequencies in the UHF and microwave ranges (400 MHz to 6 GHz), $Z_{be}$ is an impedance that appears equivalent to a resistor $R_{be}$ with values ranging from approximately 10 to 100 ohms in parallel with an inductor 303 with values ranging from approximately 5 to 10 nH. The purpose of capacitor 208 is to cancel out the inductive reactance of inductor 303. $Z_{ce}$ can be considered a resistive impedance ranging in value from approximately 40 to 200 ohms. Therefore, the loaded resonator network of the circuit in FIG. 8 would appear as shown in FIG. 9.

Figure 9:
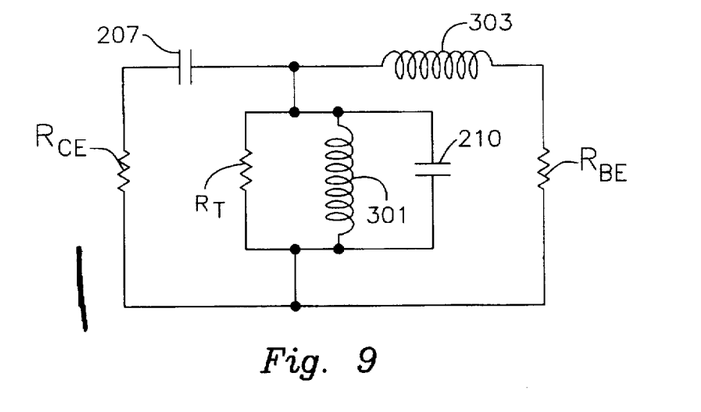
FIG.9 is a schematic drawing illustrating an equivalent embodiment of the circuit illustrated in FIG. 8.

The resonator of FIG. 9 is loaded on the left side by capacitor 207 in series with $R_{ce}$ and on the right side by inductor 303 in series with $R_{be}$. To understand how the loaded Q, $Q_L$, is affected by capacitor 207, $R_{ce}$, inductor 303 and $R_{be}$, the series combination of a capacitor (or inductor) with a resistor must be transformed into an equivalent parallel combination of a capacitor (or inductor) and a resistor. The loaded resonator can therefore be redrawn to yield the equivalent circuit shown in FIG. 10. The dotted lines of FIG. 10 enclose the tank circuit.

Capacitor 702 is small and adds to capacitor 210, thereby introducing a small decrease in the resonant frequency. Inductor 803 combines with inductor 301 as parallel inductances resulting in a smaller equivalent inductance. By itself, this would cause the resonant frequency to increase. The two effects cancel each other out to some degree. The resulting small shift in resonant frequency can be corrected by trimming capacitor 210.

The effect on loaded $Q(Q_L)$ results from $R'_{ce}$ and $R'_{be}$ of FIG. 10 combining in parallel with $R_T$ resulting in an equivalent resistance, $R_{eqv}$, less than $R_T$ and therefore a loaded Q smaller than the unloaded Q.

It can be shown for the network in FIG. 10 that $$R'_{CE} = \frac{R_{CE}^2 + \left(\frac{1}{2\pi C_{207} f_0}\right)^2}{R_{CE}} \quad \text{Equation 9}$$

$$R'_{BE} = \frac{R_{BE}^2 + (2\pi f_0 L_{803})^2}{R_{BE}} \quad \text{Equation 10}$$

where:

$C_{207}$: capacitance of capacitor 207
$f_o$: frequency of oscillation
$R'_{ce}$: equivalent collector-emitter resistance
$R'_{be}$: equivalent base-emitter resistance
$R_{ce}$: collector-emitter resistance
$R_{be}$: base-emitter resistance
$L_{803}$: inductance of inductor 803

Equation 9 shows that smaller values of capacitor 207 result in larger values of $R'_{ce}$ and equation 10 shows that larger values of inductor 303 result in larger values of $R'_{be}$. Both $R'_{ce}$ and $R'_{be}$ have to have large values to ensure a large value for loaded Q.

A comparison of the subject low phase noise oscillator with the standard microwave oscillator (prior art) shows the reason for the superior performance of this low phase noise oscillator. FIG. 11 shows the standard microwave oscillator. Capacitors 502, 504, 505 and 506 are RF bypass capacitors and can be thought of as short circuits. Inductor 603 is an RF choke. The corresponding open loop network is shown in FIG. 12. By analogy to FIG. 9, an equivalent circuit can be arrived at. This equivalent circuit is shown in FIG. 13. The tank circuit is shown enclosed in dotted lines. The $R_{ce}$, which is a low value resistor of no more than 200 ohms, is connected to the resonator through the 50 ohm load. The equivalent total resistance in parallel with the resonator therefore has a value of less than 250 ohms.

The standard microwave oscillator does not have the benefit of impedance transformation that is provided by capacitor 207 in the low phase noise oscillator. In the standard configuration there is no means to control the loaded Q because the total equivalent resistance is determined by $R_{ce}$ in series with the 50 ohm load 631. In the low phase noise oscillator, by contrast, capacitor 207 can be chosen to yield a $R_{eqv}$ in the order of kiloohms.

The equation for $L(f)$ reveals that phase noise is minimized by maximizing loaded Q ($Q_L$).

It is important to note with reference to FIG. 1 and in light of the preceeding discussion, that the values of capacitor 207 connected between the collector and a common potential, capacitor 208 connected between the base and the emitter, and inductor 303 connected between the base and the junction formed by capacitors 209 and 205, and resistors 102 and 103 are chosen to meet the following three criteria:

First: The phase shift of the band pass filter, shown enclosed in dotted lines in FIG. 4, is the negative of the transistor's in order to make the overall phase shift equal to zero at the oscillation frequency (an oscillation condition);

Second: The insertion loss caused by the bandpass filter is small enough to make the overall gain greater than unity (an oscillation condition);

Third: Capacitor 207 has a value small enough that the output impedance of the transistor does not load the resonator significantly and inductor 303 has a value large enough that the input impedance of the transistor does not load the resonator significantly. This results in a $Q_L$ very close to the resonator's unloaded Q ($Q_U$) which according to equation one, will result in lower phase noise.

This oscillator which is the subject of this invention is optimized for minimum phase noise. Output power is a secondary design goal. As a consequence, the output oscillatory signal is taken through capacitor 209 from the small RF voltage that developes across bypass capacitor 205. In this way, the 50 ohm load does not affect the oscillator's loaded Q.

Figure 2:
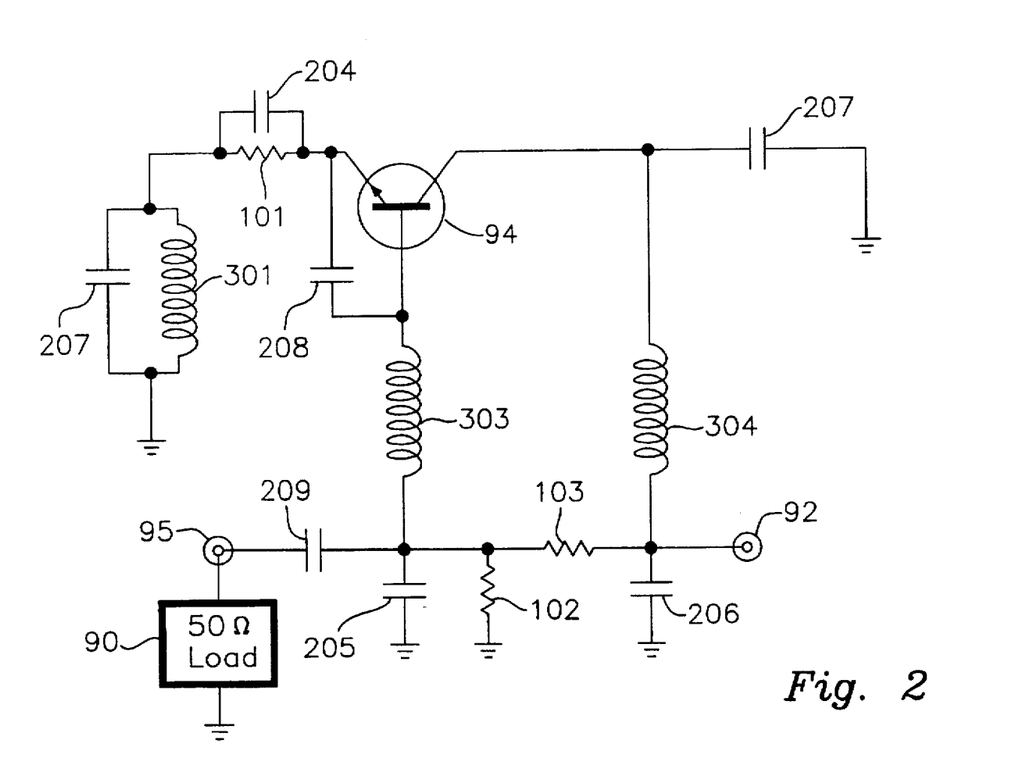
FIG. 2 is a schematic drawing illustrating another embodiment of the oscillator circuit showing the biasing components, but with the circuitry removed which enables the oscillation frequency to be varied by an applied voltage.

The voltage controlled oscillator shown in FIG. I can be converted to a fixed frequency low phase noise oscillator by removing varactor 93, capacitors 202 and 203, inductor 302, and varactor control terminal 91. The resulting embodiment is shown in FIG. 2. Many other resonators can be used in this circuit in addition to the LC resonator shown in FIG. 1. For example, the lumped inductor 301 can be replaced by a microstrip. The microstrip will have a length which is less than a quarter wavelength at the oscillation frequency so that its impedance is an inductive reactance. Inductor 301 can also be replaced by a stripline or a coaxial cable instead of the microstrip. In another embodiment, both inductor 301 and capacitor 201 can be replaced by a microstrip whose length is a quarter wavelength at the oscillation frequency. The microstrip in this configuration is essentially equivalent to a parallel combination of an inductor and a capacitor. Alternatively, both the inductor 301 and capacitor 201 can be replaced by a stripline or a coaxial line. The inductor 303 can be replaced in any embodiment by a microstrip, a stripline, or a coaxial line of length less than a quarter wavelength so that these elements act as inductive reactances in the circuit.

In the foregoing description, the invention has been described with reference to a particular preferred embodiment, although it is to be understood that specific details shown are merely illustrative, and the invention may be carried out in other ways without departing from the true spirit and scope of the following claims.

I claim:

1. An oscillator circuit exhibiting low phase noise characteristics for use in UHF and microwave applications, comprising:

a transistor having a collector, an emitter and a base;

a first capacitor connected between the collector of the transistor and a common potential;

a first inductor having a first terminal and a second terminal, said first terminal connected to the junction between the first capacitor and the collector;

a second capacitor connected on one side to the second terminal of the first inductor and on the other side to a common potential;

a first resistor having a first terminal and a second terminal, said first terminal being connected to the junction between the first inductor and the second capacitor;

a second resistor connected between the second terminal of the first resistor and a common potential;

a third capacitor connected between a common potential and the junction formed by the first resistor and the second resistor;

a D.C. supply voltage terminal connected to the junction formed by the first inductor, the second capacitor and the first resistor;

a fourth capacitor having a first and second terminal, the first terminal being connected to the junction formed by the first resistor, the second resistor and the third capacitor and the second terminal being connected to the load input which will receive the oscillating signal;

a second inductor having a first terminal and a second terminal, the first terminal being connected between the junction formed by the first resistor, the second resistor, the third capacitor and the fourth capacitor and the second terminal of the second inductor being connected to the base of the transistor;

a fifth capacitor connected between the junction formed by the base and the second inductor and the emitter of the transistor;

a sixth capacitor having a first plate and a second plate, the first plate being connected to the junction formed by the emitter of the transistor and the fifth capacitor;

a third resistor provided with a first and a second terminal, the first terminal of the third resistor being connected the junction of the emitter of the transistor, the fifth capacitor and the first plate of the sixth capacitor, and the second terminal of the second terminal of the third resistor being connected to the second plate of the sixth capacitor; and a resonating means connected to the junction between the second terminal of the third resistor and the sixth capacitor.

2. The oscillator circuit of claim 1 wherein said resonating means comprises a resonating circuit including a third inductor and a seventh capacitor, the third inductor and the seventh capacitor being connected to the common potential, and the third inductor and the seventh capacitor being connected to the junction formed by the second terminal of the third resistor and the second plate of the sixth capacitor.

3. The oscillator circuit of claim 1 wherein said resonating means comprises a resonating circuit including a microstrip and a seventh capacitor, the microstrip having a length less than a quarter wavelength at the oscillation frequency such that its impedance is an inductive reactance, the microstrip and the seventh capacitor being connected to the common potential, and the microstrip and the seventh capacitor being connected to the junction formed by the second terminal of the third resistor and the second plate of the sixth capacitor.

4. The oscillator circuit of claim 1 wherein said resonating means comprises a resonating circuit including a stripline and a seventh capacitor, the stripline having a length less than a quarter wavelength at the oscillation frequency such that its impedance is an inductive reactance, the stripline and the seventh capacitor being connected to the common potential, and the stripline and the seventh capacitor being connected to the junction formed by the second terminal of the third resistor and the second plate of the sixth capacitor.

5. The oscillator circuit of claim 1 wherein said resonating means comprises a resonating circuit including a coaxial line and a seventh capacitor, the coaxial line having a length less than a quarter wavelength at the oscillation frequency such that its impedance is an inductive reactance, the coaxial line and the seventh capacitor being connected to the common potential, and the coaxial line and the seventh capacitor being connected to the junction formed by the second terminal of the third resistor and the second plate of the sixth capacitor.

6. The oscillator circuit of claim I wherein said resonating means comprises a microstrip having a length less than a quarter wavelength at the oscillation frequency such that its impedance is an inductive reactance, the microstrip being connected to the common potential, and the microstrip being connected to the junction formed by the second terminal of the third resistor and the second plate of the sixth capacitor.

7. The oscillator circuit of claim 1 wherein said resonating means comprises a stripline having a length less than a quarter wavelength at the oscillation frequency such that its impedance is an inductive reactance, the stripline being connected to the common potential, and the stripline being connected to the junction formed by the second terminal of the third resistor and the second plate of the sixth capacitor.

8. The oscillator circuit of claim 1 wherein said resonating means comprises a coaxial line having a length less than a quarter wavelength at the oscillation frequency such that its impedance is an inductive reactance, the coaxial line being connected to the common potential, and the coaxial line being connected to the junction formed by the second terminal of the third resistor and the second plate of the sixth capacitor.

9. The oscillator circuit of claim 2 further including voltage control circuitry enabling the oscillation frequency to be controlled by an applied voltage, said voltage control circuitry comprising:

a varactor provided with a first and a second terminal, the first terminal of the varactor being the anode and the second terminal being the cathode, the first terminal of the varactor being connected between the junction formed by the second plate of the sixth capacitor, the second terminal of the third resistor, the third inductance and the seventh capacitor;

an eight capacitor connected between the second terminal of the varactor and a common potential;

a fourth inductor having a first and a second terminal, the first terminal of which is connected between the junction formed by the second terminal of the varactor and the eight capacitor;

a ninth capacitor connected between the second terminal of the fourth capacitor and a common potential; and a varactor control terminal connected to the junction of the second terminal of the fourth inductor and the ninth capacitor.

10. The oscillator circuit of claim 1 wherein said transistor has a phase shift of between one hundred and ten degrees and thirty degrees and wherein said first capacitor, said second inductor and said fifth capacitor cooperate to form a bandpass filter means such that the phase shift of the bandpass filter means is the negative of the phase shift of said transistor so that the overall phase shift is zero at the oscillation frequency, and such that the insertion loss from said bandpass filter means is small enough to make the overall gain greater than one, and wherein said first capacitor is selected to have a capacitance small enough that the output impedance of said transistor does not load said resonating means significantly, and said second inductor is selected to have an inductance large enough that the input impedance of said transistor does not load said resonating means significantly so that said oscillating circuit has a loaded Q very close to the unloaded Q of said resonating means so that the phase noise of said oscillating circuit is reduced.

11. An oscillator circuit exhibiting low phase noise characteristics for use in UHF and microwave applications, comprising:

a transistor having a collector, an emitter and a base;

a first capacitor connected between the collector of the transistor and a common potential;

a first inductor having a first terminal and a second terminal, said first terminal connected to the junction between the first capacitor and the collector;

a second capacitor connected on one side to the second terminal of the first inductor and on the other side to a common potential;

a first resistor having a first terminal and a second terminal, said first terminal being connected to the junction between the first inductor and the second capacitor;

a second resistor connected between the second terminal of the first resistor and a common potential;

a third capacitor connected between a common potential and the junction formed by the first resistor and the second resistor;

a D.C. supply voltage terminal connected to the junction formed by the first inductor, the second capacitor and the first resistor;

a fourth capacitor having a first and second terminal, the first terminal being connected to the junction formed by the first resistor, the second resistor and the third capacitor and the second terminal being connected to the input to the load which will receive the oscillating signal;

an inductive reactance means having a first terminal and a second terminal, the first terminal being connected between the junction formed by the first resistor, the second resistor, the third capacitor and the fourth capacitor and the second terminal of said inductive reactance means being connected to the base of the transistor;

a fifth capacitor connected between the junction formed by the base and the second inductor and the emitter of the transistor;

a sixth capacitor having a first plate and a second plate, the first plate being connected to the junction formed by the emitter of the transistor and the fifth capacitor;

a third resistor provided with a first and a second terminal, the first terminal of the third resistor being connected to the junction of the emitter of the transistor, the fifth capacitor and the first plate of the sixth capacitor, and the second terminal of the third resistor being connected to the second plate of the sixth capacitor; and p1 a resonating means connected to the junction between the second terminal of the third resistor and the sixth capacitor.

12. The oscillator circuit of claim 11 wherein said inductive reactance means comprises a microstrip having a length less than a quarter wavelength at the oscillation frequency such that its impedance is an inductive reactance.

13. The oscillator circuit of claim 11 wherein said inductive reactance means comprises a stripline having a length less than a quarter wavelength at the oscillation frequency such that its impedance is an inductive reactance.

14. The oscillator circuit of claim 11 wherein said inductive reactance means comprises a coaxial line having a length less than a quarter wavelength at the oscillation frequency such that its impedance is an inductive reactance.

* * * * *